(12) United States Patent
Hsu et al.

(10) Patent No.: US 12,328,956 B2
(45) Date of Patent: Jun. 10, 2025

(54) INTEGRATED CIRCUIT PHOTODETECTOR

(71) Applicant: Taiwan Semiconductor Manufacturing Co., Ltd., Hsinchu (TW)

(72) Inventors: Chun-Wei Hsu, Hsinchu (TW); Tsai-Hao Hung, Hsinchu (TW); Chung-Yu Lin, Hsinchu (TW); Ying-Hsun Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/435,872

(22) Filed: Feb. 7, 2024

(65) Prior Publication Data

US 2024/0178264 A1  May 30, 2024

Related U.S. Application Data

(60) Division of application No. 17/723,127, filed on Apr. 18, 2022, now Pat. No. 11,923,396, which is a
(Continued)

(51) Int. Cl.
| | |
|---|---|
| *H10F 77/122* | (2025.01) |
| *H10F 39/00* | (2025.01) |
| *H10F 39/18* | (2025.01) |
| *H10F 71/00* | (2025.01) |
| *H10F 77/40* | (2025.01) |

(Continued)

(52) U.S. Cl.
CPC .......... *H10F 39/18* (2025.01); *H10F 39/024* (2025.01); *H10F 39/8063* (2025.01); *H10F 39/807* (2025.01); *H10F 71/121* (2025.01); *H10F 77/122* (2025.01); *H10F 77/413* (2025.01); *H10F 77/703* (2025.01); *H10F 39/8037* (2025.01); *H10F 39/811* (2025.01); *H10F 71/1212* (2025.01); *H10F 71/1215* (2025.01); *H10F 71/1253* (2025.01); *H10F 71/1272* (2025.01); *H10F 77/1237* (2025.01); *H10F 77/1248* (2025.01); *H10F 77/127* (2025.01)

(58) Field of Classification Search
None
See application file for complete search history.

(56) References Cited

U.S. PATENT DOCUMENTS

| | | |
|---|---|---|
| 6,271,537 B1 | 8/2001 | Gunapala et al. |
| 7,922,976 B2 | 4/2011 | Dutta et al. |
| | (Continued) | |

FOREIGN PATENT DOCUMENTS

| | | |
|---|---|---|
| CN | 1992299 A | 7/2007 |
| CN | 102696114 A | 9/2012 |
| | (Continued) | |

*Primary Examiner* — Scott B Geyer
(74) *Attorney, Agent, or Firm* — Seed IP Law Group

(57) ABSTRACT

An integrated circuit includes a photodetector. The photodetector includes one or more dielectric structures positioned in a trench in a semiconductor substrate. The photodetector includes a photosensitive material positioned in the trench and covering the one or more dielectric structures. A dielectric layer covers the photosensitive material. The photosensitive material has an index of refraction that is greater than the indices of refraction of the dielectric structures and the dielectric layer.

20 Claims, 13 Drawing Sheets

Related U.S. Application Data continuation of application No. 16/788,145, filed on Feb. 11, 2020, now Pat. No. 11,309,347.

(51) Int. Cl.
*H10F 77/70* (2025.01)
*H10F 77/12* (2025.01)
*H10F 77/123* (2025.01)
*H10F 77/124* (2025.01)

(56) References Cited

U.S. PATENT DOCUMENTS

| | | |
|---|---|---|
| 7,972,885 B1 | 7/2011 | Dutta et al. |
| 9,105,774 B2 | 8/2015 | Ooka |
| 9,553,224 B2 | 1/2017 | Kawaguchi et al. |
| 9,564,549 B2* | 2/2017 | Knoll ............... H10F 77/206 |
| 10,367,023 B1 | 7/2019 | Chou et al. |
| 10,475,837 B2 | 11/2019 | Moriya et al. |
| 10,553,733 B2 | 2/2020 | Huang et al. |
| 2002/0159126 A1 | 10/2002 | Sigalas et al. |
| 2003/0128949 A1 | 7/2003 | Kitagawa et al. |
| 2006/0006485 A1 | 1/2006 | Mouli |
| 2007/0204901 A1 | 9/2007 | Dutta |
| 2009/0101909 A1* | 4/2009 | Chen ............... H10F 71/1212 |
| | | 257/65 |
| 2009/0260687 A1 | 10/2009 | Park |
| 2010/0012184 A1 | 1/2010 | Naya et al. |
| 2010/0176375 A1* | 7/2010 | Lochtefeld ........ H01L 21/02636 |
| | | 257/655 |
| 2011/0037133 A1* | 2/2011 | Su ................ H10F 71/121 |
| | | 257/E31.127 |
| 2011/0241148 A1 | 10/2011 | Hiyama et al. |
| 2011/0309237 A1 | 12/2011 | Seo et al. |
| 2012/0038814 A1 | 2/2012 | Tayanaka |
| 2012/0129302 A1 | 5/2012 | Assefa et al. |
| 2012/0273911 A1 | 11/2012 | Shigeta et al. |
| 2015/0048467 A1 | 2/2015 | Weng et al. |
| 2016/0043250 A1 | 2/2016 | Smith et al. |
| 2016/0308075 A1* | 10/2016 | Wang ............... H10F 77/147 |
| 2018/0277577 A1 | 9/2018 | Cheng et al. |
| 2019/0019899 A1 | 1/2019 | Wang et al. |
| 2019/0393251 A1 | 12/2019 | Gäbler |
| 2020/0058697 A1 | 2/2020 | Meylan |
| 2020/0098801 A1 | 3/2020 | Chou et al. |
| 2020/0400568 A1 | 12/2020 | Kabiri et al. |
| 2021/0143196 A1 | 5/2021 | Uchida et al. |
| 2021/0351221 A1 | 11/2021 | Hung et al. |
| 2021/0366964 A1 | 11/2021 | Ito et al. |

FOREIGN PATENT DOCUMENTS

| | | |
|---|---|---|
| CN | 105229790 A | 1/2016 |
| CN | 106463518 A | 2/2017 |
| CN | 107683526 A | 2/2018 |
| JP | 2003035845 A | 2/2003 |
| JP | 2012142501 A | 7/2012 |
| JP | 2014036038 A | 2/2014 |
| JP | 2015095293 A | 5/2015 |
| KR | 10-2009-0105732 A | 10/2009 |
| TW | 201834231 A | 9/2018 |
| TW | 201843825 A | 12/2018 |
| TW | 202001298 A | 1/2020 |
| WO | WO 2012053491 A1 | 4/2012 |
| WO | WO 2014045334 A1 | 3/2014 |
| WO | WO 2019124562 A1 | 6/2019 |

* cited by examiner

INTEGRATED CIRCUIT PHOTODETECTOR

BACKGROUND

Technical Field

The present disclosure relates to the field of integrated circuit photonics. The present disclosure relates more particularly to photodetectors within integrated circuits.

Description of the Related Art

Many photonic integrated circuits include photodetectors. The photodetectors detect light and generate electrical signals indicative of the light. If the photodetectors do not absorb incident light, then the photodetectors will not generate an electrical signal even though the light is incident on the photodetectors. This represents a lack of sensitivity of the photodetectors.

DETAILED DESCRIPTION

Figure 1:
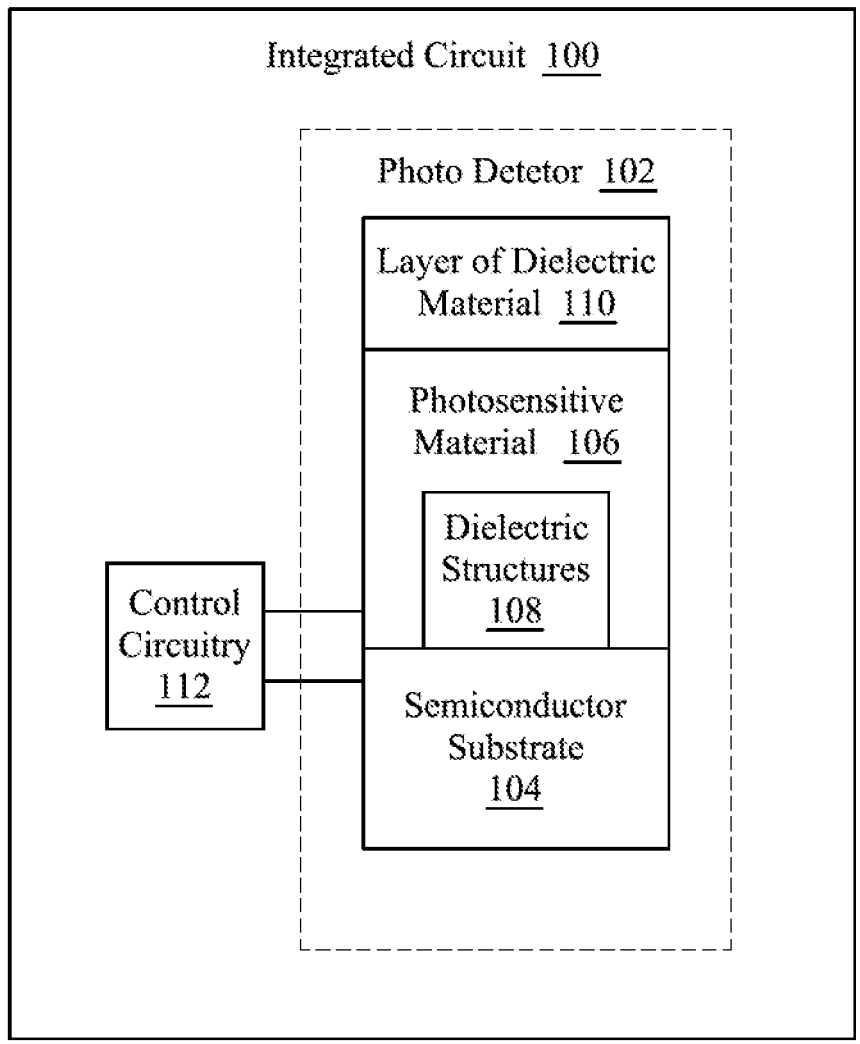
FIG. 1 is a block diagram of an integrated circuit, according to one embodiment.
Figure 1:
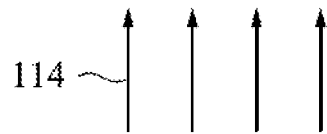

In the following description, many thicknesses and materials are described for various layers and structures within an integrated circuit. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

FIG. 1 is a block diagram of an integrated circuit 100, according to one embodiment. The integrated circuit 100 includes a photodetector 102 and control circuitry 112. The photodetector 102 includes a semiconductor substrate 104, a photosensitive material 106, dielectric structures 108, and the layer of dielectric material 110. The components of the integrated circuit 100 operate to detect one or more parameters of incoming light.

The integrated circuit 100 can include various layers and structures not illustrated in detail in FIG. 1. For example, the integrated circuit 100 can include various layers of semiconductor material, various layers of dielectric material, and various metal interconnect structures. The integrated circuit 100 can include transistors coupled together in complex arrangements.

The photodetector 102 of the integrated circuit 100 is configured to detect one or more parameters of incoming light. For example, light 114 may be incident on the integrated circuit 100. The light 114 may pass through various layers of transparent material and may be received at the photodetector 102. The photodetector 102 detects the light 114.

The control circuitry 112 is coupled to the photodetector 102. The control circuitry 112 can receive signals from the photodetector 102 including electrical signals generated responsive to detecting light. The control circuitry 112 can process the electrical signals and can output data or other signals indicative of one or more parameters of the light 114 detected by the photodetector 102.

In one embodiment, the control circuitry 112 includes a plurality of transistors formed in the integrated circuit 100. The transistors can take part in operating the photodetector 102 and the processing the signals received from the photodetector 102. The transistors can also take part in other processes related to function of the integrated circuit 100 including reading data from memory, writing data to memory, processing data, outputting data, and controlling communications.

In one embodiment, the control circuitry 112 can apply voltages to the photodetector 102. The control circuitry 112 can bias the photodetector to ensure that light received by the photodetector 102 will result in the generation of electrical signals that can be read by the control circuitry 112. Accordingly, the control circuitry 112 can be coupled to the photodetector 102 by metal interconnect lines, metal plugs, and conductive contacts by which voltages can be applied to the photodetector 102 and signals can be received from the photodetector 102.

In one embodiment, the photodetector 102 operates by absorbing light 114. More particularly, the light 114 is made up of photons that can be absorbed by the photodetector 102. When the photodetector 102 absorbs a photon, an electrical signal is generated responsive to the absorption of the photons. Accordingly, characteristics of the light 114, or merely the presence of the light 114, are indicated by the electrical signals generated by the photodetector 102 responsive to absorbing photons.

When light travels through a first material and is incident on a boundary between the first material and a second material, the light may be reflected at the boundary or may be transmitted through the boundary into the second material. The reflection or transmission of light at a boundary between two materials is based on the characteristics of the two materials and the characteristics of the light. The relevant characteristics of the two materials can include their transmission and reflection coefficients. The relevant characteristics of the light can include the wavelength of the light and the angle at which the light is incident on the boundary.

As light travels through a material, some of the light may be absorbed by the material. The amount of light that will be absorbed by material is based, in part, on the absorption coefficient of the material and on the length of the path light takes through the material. A higher coefficient of absorption results in a higher rate of absorption. Likewise, a longer path of travel to a material results in a higher rate of absorption in the material. Additionally, the coefficient of absorption for a material varies with the wavelength of light. A material may absorb some wavelengths of light more readily than other wavelengths of light.

An individual photon passing through a material has a probability of being absorbed by the material. The probability of absorption depends on the wavelength of the photon, the absorption coefficient of the material for that wavelength, and the length of the path that the photon travels through the material. All these factors are relevant in the way the photodetector 102 detects light.

The photodetector 102 utilizes the photosensitive material 106 to absorb, and thereby detect, light. The photosensitive material 106 is a material that has a relatively high absorption coefficient for a selected range of wavelengths of light. The selected range may correspond to a particular color of visible light. The selected range may correspond to a range of wavelengths associated with optical communication.

The integrated circuit 100 is configured to allow light 114 to pass through various layers to the photosensitive material 106 without being absorbed or reflected prior to reaching the photosensitive material 106. Accordingly, the integrated circuit 100 can include multiple transparent layers having low coefficients of absorption and reflection, thereby enabling light 114 to pass through the integrated circuit 100 to the photosensitive material 106.

The photodetector 102 utilizes the dielectric structures 108 to enhance the sensitivity of the photodetector 102. The dielectric structures 108 enhance the sensitivity of the photodetector by 102 by increasing the length of the path taken by individual photons through the photosensitive material 106. In particular, the dielectric structures 108 are positioned to promote reflection of the photons within the photosensitive material 106 without exiting the photosensitive material 106. The more times an individual photon is reflected by the dielectric structures 108 within the photosensitive material 106, the longer the path length of the photon is within the photosensitive material 106. The longer path within the photosensitive material 106 results in a higher likelihood that the photon will be absorbed by the photosensitive material 106. Accordingly, a longer path within the photosensitive material 106 results in an effective increase in the sensitivity of the photodetector 102.

The dielectric structures 108 help to increase the path of the photons within the photosensitive material 106 based on the principle of total internal reflection. Total internal reflection occurs when light traveling through a first material having a first index of refraction $n_1$ encounters a boundary between the first material and a second material having a second index of refraction $n_2$ that is lower than the index of refraction $n_1$ of first material. If the angle of incidence of the light on the boundary is greater than a critical angle $\theta_c$, then total internal reflection will occur and the light will be reflected at the boundary rather than being transmitted through the boundary into the second material. The value of the critical angle $\theta_c$ is given by the following relationship:

$$\theta_c = \arcsin(n_2/n_1),$$

where $n_2 < n_1$. Accordingly, the photosensitive material 106 and the dielectric material of the dielectric structures 108 are selected such that the photosensitive material 106 has a higher index of refraction then the index of refraction of the dielectric material of the dielectric structures 108. The greater the difference in the indices of refraction of the photosensitive material 106 and the dielectric material of the dielectric structures 108, the larger will be the range of angles of incidence that result in total internal reflection. In the present description the index of refraction of the dielectric material of the dielectric structures is alternatively referred to as the index of refraction of the dielectric structures 108.

In one embodiment, the dielectric structures 108 are positioned on a surface of the semiconductor substrate 104. The dielectric structures 108 protrude from the surface of the semiconductor substrate 104. The photosensitive material 106 covers the dielectric structures 108. The positions and shapes of the dielectric structures 108 and dimensions and shape of the photosensitive material 106 are selected to result in the reflection of light off of the dielectric structures 108 within the photosensitive material 106. The relative positions and shapes can be selected to result in total internal reflection of light within the photosensitive material 106 for a wide range of angles of light entering the photosensitive material 106, as will be described in more detail below.

In one embodiment, the dielectric structures 108 include one or more columns or pillars of dielectric material protruding or extending from the surface of the semiconductor substrate 104 into the photosensitive material 106.

In one embodiment, the dielectric structures 108 can also include dielectric material positioned between the photosensitive material 106 and sidewalls of a material bounding the photosensitive material 106. Accordingly, if light reflects from a pillar of dielectric material and travels toward a sidewall of the photosensitive material 106, the light may again be reflected from the dielectric material positioned between the photosensitive material 106 and the sidewall of the material that bounds the photosensitive material 106.

In one embodiment, the photosensitive material 106 is positioned in a trench formed in the semiconductor substrate 104. One or more columns or pillars of dielectric material can protrude from a bottom surface of the trench and can have lateral and upper surfaces entirely covered by the photosensitive material 106. Sidewalls of the trench can be covered in the same dielectric material. Light that passes from the semiconductor substrate 104 into the photosensitive material 106 can be reflected multiple times between the one or more columns and the dielectric material covering sidewalls of the trenches. This can greatly increase the average path length of light passing through the photosensitive material 106.

In one embodiment, the layer of dielectric material 110 covers a top surface of the photosensitive material 106. The layer of dielectric material 110 is selected to promote total internal reflection of light incident on the boundary between the photosensitive material 106 and the layer of dielectric material 110 from within the photosensitive material 106. Accordingly, the dielectric material of the layer of dielectric material 110 has an index of refraction that is lower than the index of refraction of the photosensitive material 106.

In one embodiment, light that enters the photosensitive material 106 can reflect multiple times at the boundaries between the photosensitive material 106 and the dielectric structures 108 and the boundaries between the photosensitive material 106 and the layer of dielectric material 110. Depending on the magnitude of the difference between the indices of refraction of the photosensitive material 106 and the dielectric structures 108, and between the photosensitive material 106 and the dielectric material of the layer of dielectric material 110, light passing through the photosensitive material 106 may undergo a large number of internal reflections. This can greatly increase the length of the path of travel of the light through the photosensitive material 106. The increase in the length of the path of travel results in a corresponding increase in the sensitivity of the photodetector 102.

In one embodiment, the photodetector 102 includes a photodiode. The photodiode includes multiple regions of semiconductor material. For example, the photosensitive material can include a monocrystalline semiconductor material doped with a first dopant type, either P-type or N-type. The semiconductor substrate 104 can include a monocrystalline semiconductor material doped with a second dopant type that is the complement of the first dopant type. The photosensitive material 106 and the semiconductor substrate 104 form a P-N junction. When a photon of light is absorbed by the photosensitive material 106, an electron receives an energy corresponding to the wavelength of the photon and moves from the valence band into the conduction band. The control circuitry 112 biases the photosensitive material 106 and the semiconductor substrate 104 such that the electron in the conduction band flows as an electrical current detected by the control circuitry 112. Accordingly, the control circuitry 112 detects the brightness or intensity of the light 114 as an electrical current formed by electrons that transition from the valence band to the conduction band by the absorption of light. The photodiode can include other configurations of P and N semiconductor regions than those described above without departing from the scope of the present disclosure. Additionally, the photodiode can include P and N regions separated by intrinsic semiconductor regions. The intrinsic semiconductor regions can correspond to semiconductor reasons that are substantially free of dopants.

In one embodiment, the photodetector 102 can be a photodetector other than a photodiode. Many possible configurations of a photodetector are possible utilizing absorption of light by a photosensitive material 106. The principles of utilizing the dielectric structures 108 and the layer of dielectric material 110 to increase the path length of light within the photosensitive material 106 as described herein can be implemented in these other types of photodetectors without departing from the scope of the present disclosure.

In one embodiment, the photosensitive material 106 includes germanium, the dielectric structures 108 include silicon dioxide, and the layer of dielectric material 110 includes silicon dioxide. Germanium has a relatively high absorption coefficient for wavelengths of light between 400 nm and 1700 nm. Additionally, germanium has a relatively high index of refraction of 4. Silicon dioxide has an index of refraction of 1.46. This combination of materials results in a critical angle of:

$$\theta_c=\arcsin(1.46/4)=21.4°.$$

Accordingly, any angle of incidence of light greater than 21.4° between the photosensitive material 106 and the dielectric structures 108 or between the photosensitive material 106 and the layer of dielectric material 110 will result in total internal reflection.

The photosensitive material 106 can include materials other than germanium. For example, the photosensitive material 106 can include silicon, silicon germanium, indium gallium arsenide, lead sulfide, mercury cadmium telluride, or other photosensitive materials. Those of skill in the art will recognize, in light of the present disclosure, that the photosensitive material 106 can include materials other than those described above without departing from the scope of the present disclosure. The photosensitive material 106 can include one or more P doped regions. The photosensitive material 106 can include one or more N doped regions. The photosensitive material 106 may include both P doped regions and N doped regions The dielectric structures 108 can include materials other than silicon dioxide. For example, the dielectric structures 108 can include silicon nitride, carbon doped silicon oxide, or other dielectric materials. Many kinds of dielectric materials can be utilized for the dielectric structures 108 without departing from the scope of the present disclosure.

The layer of dielectric material 110 can include materials other than silicon dioxide. For example, the dielectric material 110 can include silicon nitride, carbon doped silicon oxide, or other dielectric materials. Many kinds of dielectric materials can be utilized for the dielectric material 110 without departing from the scope of the present disclosure.

The semiconductor substrate 104 may include one or more layers of semiconductor material including silicon, germanium, silicon germanium, silicon carbide, gallium arsenide, indium arsenide, indium phosphide, silicon germanium carbide, gallium arsenide phosphide, or gallium indium phosphide. Other semiconductors can be used for the semiconductor substrate 104 without departing from the scope of the present disclosure.

While only a single photodetector 102 is shown in FIG. 1, in one embodiment the integrated circuit 100 can include a plurality of photodetectors 102. The integrated circuit 100 can include multiple types of photodetectors 102 for detecting different wavelengths of light. The integrated circuit 100 may also include lenses for focusing light onto the photosensitive material 106 of each photodetector 102.

The integrated circuit 100 may include a front side illumination integrated circuit. In the front side illumination integrated circuit, light passes from a front side of the integrated circuit 100 into the photosensitive material 106. Lenses may be mounted on the front side, or near the front side within the integrated circuit 100 to focus light onto the photosensitive material 106.

The integrated circuit 100 may include a back side illumination integrated circuit. In the back side illumination integrated circuit, light passes from a back side of the integrated circuit 100 into the photosensitive material 106. Lenses may be mounted on the back side or within the integrated circuit 100 near the back or bottom side to focus light onto the photosensitive material 106.

The integrated circuit 100 may be bonded to a second integrated circuit. The integrated circuit 100 may pass electronic signals generated by the photodetector 102 to circuitry included in the second integrated circuit. The second integrated circuit may include processing circuitry to process the electrical signals.

Figure 2:
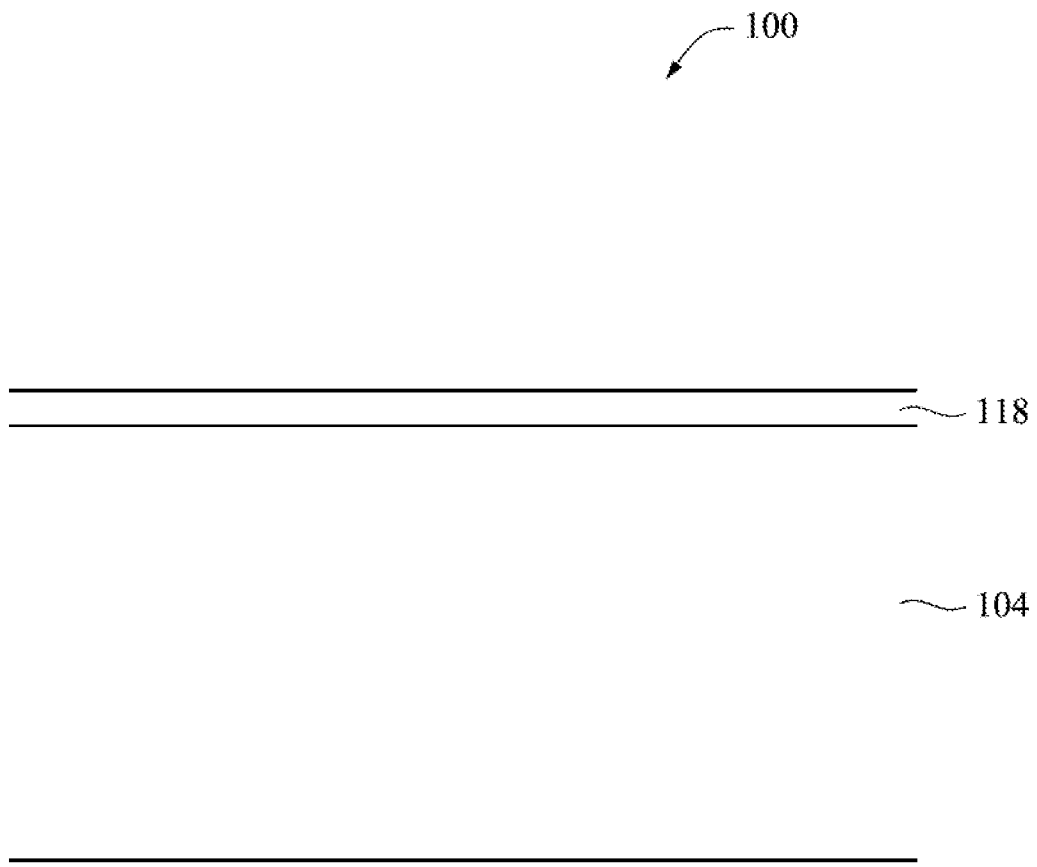
FIGS. 2-6B and 8 illustrate cross-sectional diagrams of an integrated circuit during various stages of fabrication, according to one embodiment.

FIG. 2 is a cross-sectional view of a portion of an integrated circuit 100 at an intermediate stage of processing, according to one embodiment. In particular, the view of FIG. 2 illustrates a portion of a process for forming a photodetector 102 within the integrated circuit 100. At the stage shown in FIG. 2, the illustrated portion of the integrated circuit 100 includes a semiconductor substrate 104 and a layer of dielectric material 118.

The semiconductor substrate 104 may include one or more layers of semiconductor material. The semiconductor material can include silicon, germanium, silicon germanium, silicon carbide, gallium arsenide, indium arsenide, indium phosphide, silicon germanium carbide, gallium arsenide phosphide, or gallium indium phosphide. Other semiconductor materials can be used for the semiconductor substrate 104 without departing from the scope of the present disclosure. The semiconductor substrate 104 can include a monocrystalline semiconductor material or multiple layers of monocrystalline semiconductor material.

In one embodiment, the layer of dielectric material 118 can include silicon oxide, silicon nitride, or another dielectric material. The layer of dielectric material 118 is between 1 μm and 500 μm in thickness. The layer of dielectric material 118 can be deposited by one or more thin-film deposition processes including chemical vapor deposition, physical vapor deposition, plasma enhanced chemical vapor deposition, atomic layer deposition, or other types of deposition processes. The layer of dielectric material 118 can include other materials, thicknesses, and deposition processes than those described above, without departing from the scope of the present disclosure.

Figure 3:
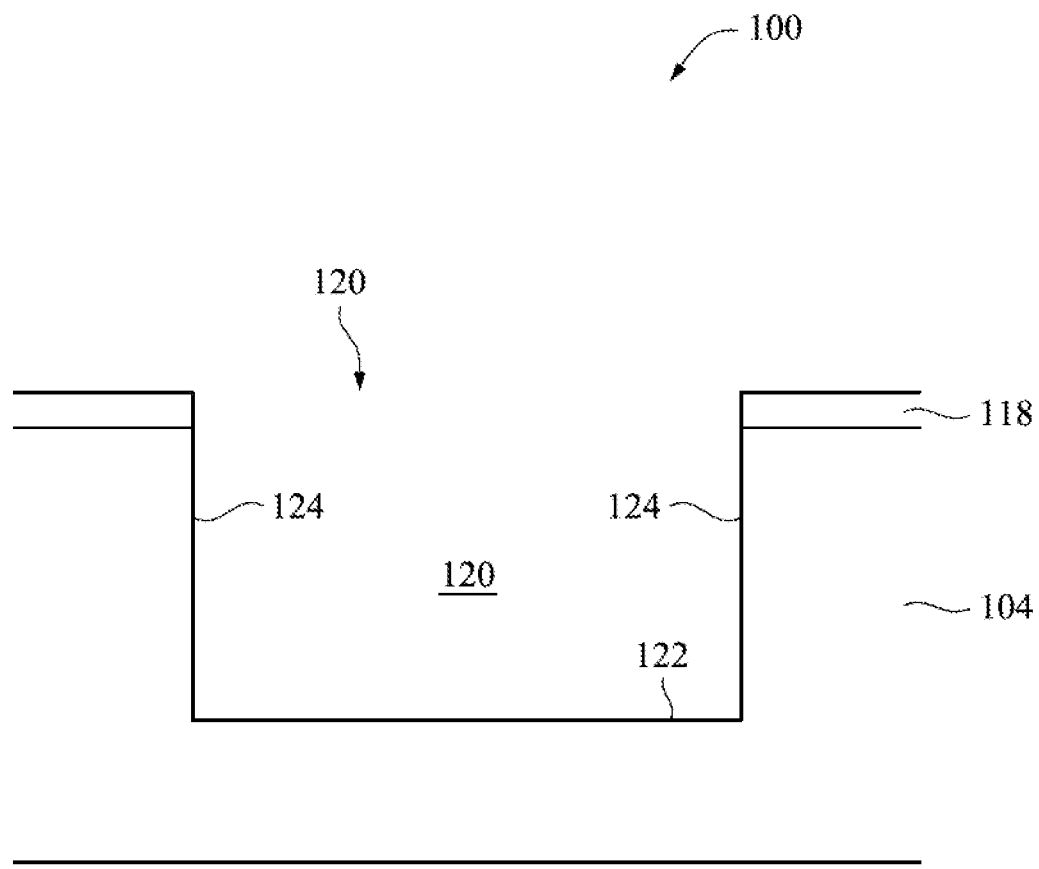

FIG. 3 is a cross-sectional view of a portion of the integrated circuit 100 at an intermediate stage of processing, according to one embodiment. In FIG. 3 a trench 120 has been opened in the semiconductor substrate 104. The trench 120 defines a bottom 122 and sidewalls 124. The trench 120 can have a depth of up to 700 μm. The trench 120 can have a width of up to 700 μm. The trench 120 can have other dimensions and those described above without departing from the scope of the present disclosure.

In one embodiment, the trench 120 is formed by utilizing photolithography techniques. The photolithography techniques can include depositing photoresist on the layer of dielectric material 118, exposing the photoresist to light via a photolithography mask, and removing portions of the photoresist in accordance with the pattern defined by the mask.

After the photoresist has been patterned, the integrated circuit 100 is exposed to an etching process. The etching process first etches exposed portions of the layer of dielectric material 118. The layer of dielectric material 118 can be etched using one or more wet etches, dry etches, or other types etching processes. The semiconductor substrate 104 can be etched during the same etching process that etches the layer of dielectric material 118. Alternatively, the semiconductor substrate 104 can be etched using a separate etching process after the exposed portion of the layer of dielectric material 118 has been etched.

After the one or more etching processes have been performed on the exposed portions of the layer of dielectric material 118 and the semiconductor substrate 104, the trench 120 has been formed. The trench 120 includes the sidewalls 124 and the bottom surface 122.

Figure 4:
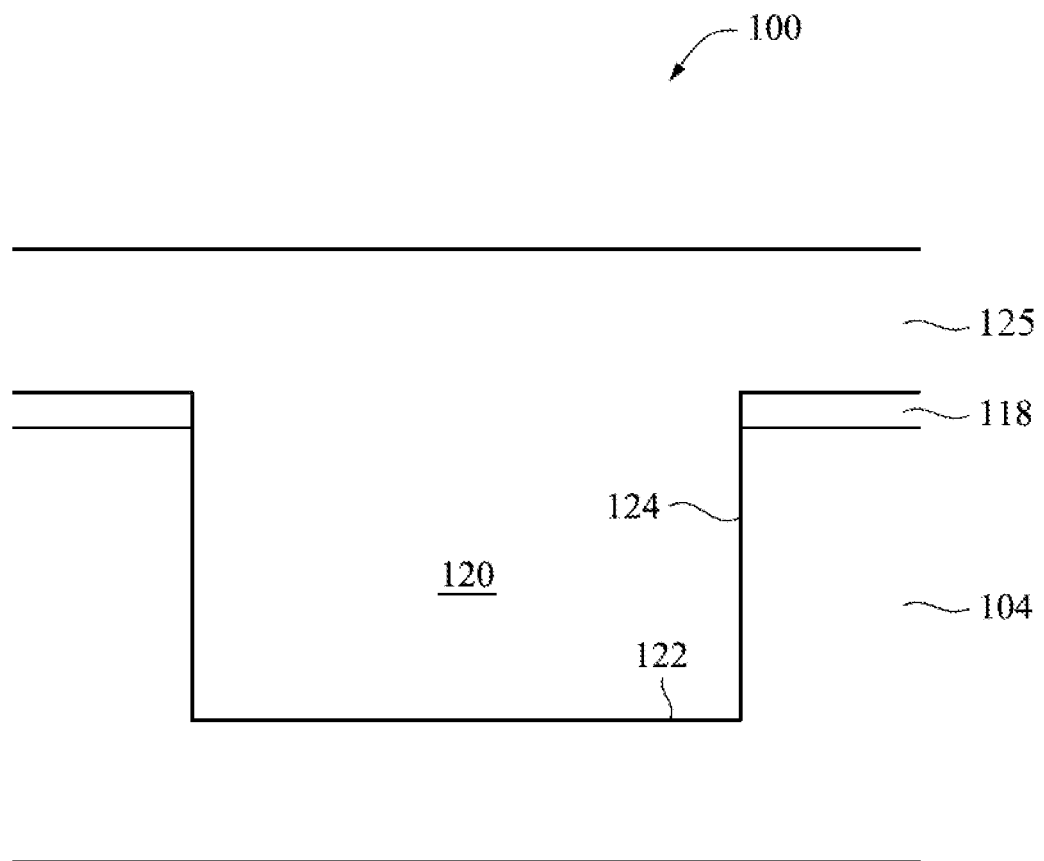

FIG. 4 is a cross-sectional view of a portion of the integrated circuit 100 at an intermediate stage of processing, according to one embodiment. In FIG. 4 a layer of dielectric material 125 has been deposited on the layer of dielectric material 118 and on the semiconductor substrate 104 in the trench 120. The layer of dielectric material 125 can include silicon dioxide, silicon nitride, or another dielectric material. The layer of dielectric material 125 can be deposited by a thin film deposition process including one or more of chemical vapor deposition, physical vapor deposition, plasma enhanced chemical vapor deposition, atomic layer deposition, or other thin-film deposition techniques. Other dielectric materials and deposition processes can be utilized for the layer of dielectric material 125 than those described above without departing from the scope of the present disclosure.

Figure 5:
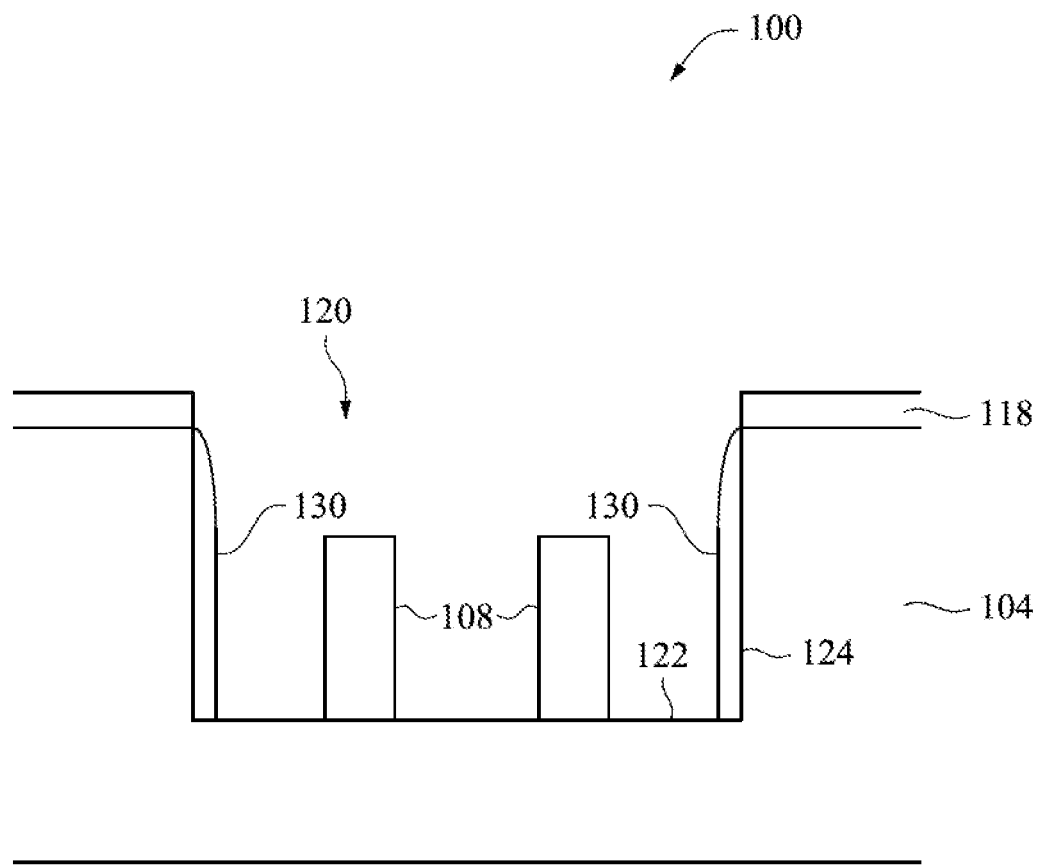

FIG. 5 is a cross-sectional view of a portion of the integrated circuit 100 at an intermediate stage of processing, according to one embodiment. In FIG. 5, the layer of dielectric material 125 has been patterned and etched, leaving dielectric structures 108 protruding from the bottom surface 122 of the trench 120. A dielectric sidewall coating 130 remains on the sidewall 124 of the trench 120 after the one or more etching processes. The dielectric sidewall coating 130 and the dielectric structures 108 are remnants of the layer of dielectric material 125.

The dielectric structures 108 and the dielectric sidewall coating 130 can be formed, in part, by utilizing photolithography techniques. For example, the photolithography techniques can include depositing photoresist on the layer of dielectric material 125, exposing the photoresist to light via a photolithography mask, and removing portions of the photoresist in accordance with the pattern defined by the mask.

After the photoresist has been patterned, the exposed portions of the layer of dielectric material 125 are subjected to an anisotropic etching process. The anisotropic etching process selectively etches in the downward direction. This means that the anisotropic etching process etches the layer of dielectric material 125 in the downward direction but not in other directions. More particularly, the anisotropic etch etches the layer of dielectric material much more rapidly in the downward direction than in other directions.

After the first anisotropic etching process, the photoresist can be removed. The remaining portions of the layer of dielectric material 125 are then subject to a timed anisotropic etch. The timed anisotropic etch etches the remaining portions of the layer of dielectric material in the downward direction for a selected period of time. The period of time can be selected so that the dielectric structures 108 have the desired height after conclusion of the etch. In one example, the height of the dielectric structures 108 is between 5 μm and 15 μm. In one embodiment, the height of the dielectric structures 108 is selected to be a little more than half the depth of the trench such that the dielectric structures 108 do not protrude beyond the top of the trench 120. The dielectric structures 108 can have heights other than those described herein without departing from the scope of the present disclosure.

In one embodiment, the dielectric structures 108 have the shape of a pillar, a column, or a wall. The dielectric structures 108 can extend along the breadth of the trenches 120 into and out of the page of the drawing in accordance with the view of FIG. 5. The dielectric structures 108 can have other shapes, profiles, and dimensions than those described above without departing from the scope of the present disclosure.

While FIG. 5 shows two dielectric structures 108, in practice different numbers of dielectric structures 108 can be positioned in the trench 120. For example, a single dielectric structure 108 may be positioned in the trench. Alternatively, more than two dielectric structures may be positioned in the trench. The dielectric sidewall coatings may also be considered to be among the dielectric structures 108.

Figure 6A:
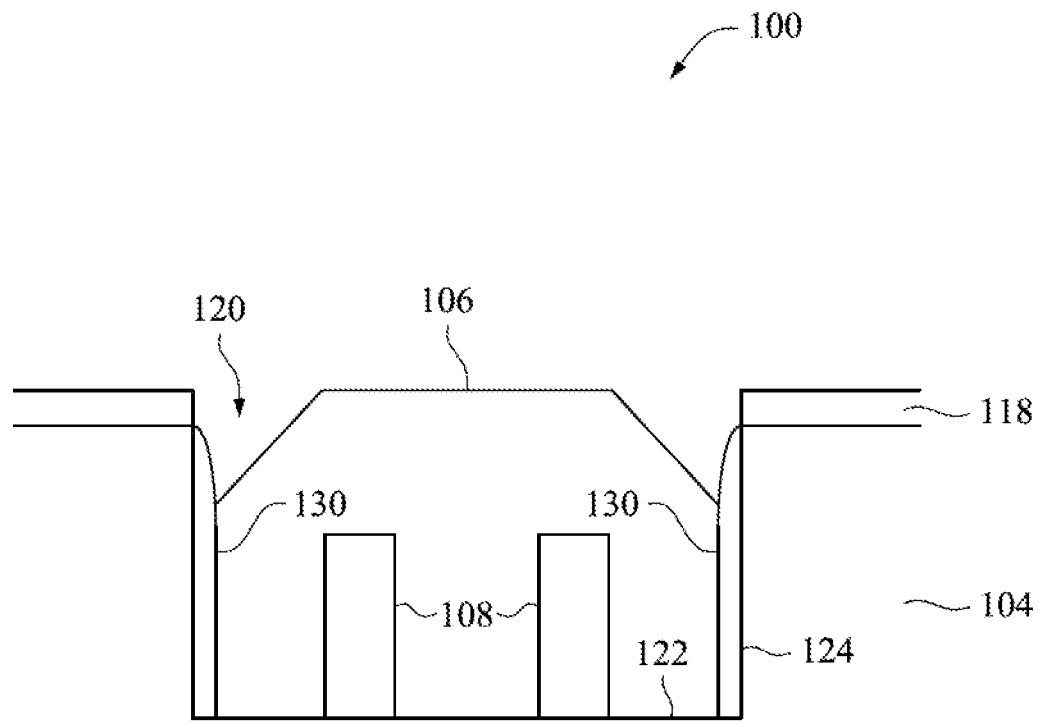

FIG. 6A is a cross-sectional diagram of the integrated circuit 100 at an intermediate stage of processing, according to one embodiment. In FIG. 6A, the photosensitive material 106 has been deposited in the trench 120. The photosensitive material 106 covers the dielectric structures 108 such that the dielectric structures 108 are positioned within the photosensitive material 106. The photosensitive material 106 is also positioned against the dielectric sidewall coatings 130.

As described previously in relation to FIG. 1, the photosensitive material 106 is a material with a relatively high absorption coefficient for a selected range of wavelengths of light. Additionally, the photosensitive material 106 is a material with a relatively high index of refraction in comparison to the dielectric material of the dielectric structures 108 and the dielectric material of the dielectric sidewall coating 130. Accordingly, the photosensitive material 106 is selected to promote total internal reflection of light within the photosensitive material 106 in conjunction with the dielectric structures 108 and the dielectric sidewall coatings 130.

In one embodiment, the photosensitive material 106 includes one or more of germanium, silicon, silicon germanium, indium gallium arsenide, lead sulfide, Mercury cadmium Telluride, or other photosensitive materials. Those of skill in the art will recognize, in light of the present disclosure, that the photosensitive material 106 can include materials other than those described above without departing from the scope of the present disclosure.

In one embodiment, the photosensitive material 106 forms a photodiode in conjunction with the semiconductor substrate 104. Accordingly, the photosensitive material 106 can include a monocrystalline semiconductor structure. The photosensitive material 106 can include one or more doped regions for functioning as a photodiode. The photosensitive material 106 can include one or more P doped regions. The photosensitive material 106 can include one or more N doped regions. The photosensitive material 106 may include both P doped regions and N doped regions In one embodiment, the photosensitive material 106 is deposited in the trench 120 via an epitaxial growth. In particular, the photosensitive material 106 can be grown epitaxially from the semiconductor substrate 104. The crystalline structure of the semiconductor substrate 104 acts as a seed to grow the crystalline structure of the photosensitive material 106.

The epitaxial growth can occur in one or more stages. If the photosensitive material 106 is to be doped, then the doping can occur in situ during the epitaxial growth of the photosensitive material 106. If the photosensitive material 106 is to include multiple differently doped regions, then the doping can occur in situ during successive stages of the epitaxial growth process. The photosensitive material 106 can include intrinsic regions with comparatively little doping, or no doping. The doping profiles and the types of doping or lack doping in various regions is selected in accordance with the design of the photodetector 102 in conjunction with the semiconductor substrate 104.

The epitaxial growth process or processes continue until the photosensitive material 106 entirely covers the dielectric structures 108. The photosensitive material 106 may also entirely cover the dielectric sidewall coating 130. The photosensitive material 106 may protrude above the top surface of the layer of dielectric material 108. Accordingly, the photosensitive material 106 may have a height that is greater than the depth of the trench 120 and the thickness of the layer of dielectric material 118. Alternatively, the photosensitive material may have a height that does not exceed the top of the trench 120 the top of the layer of dielectric material 118. The photosensitive material can have other shapes and heights than those described herein without departing from the scope of the present disclosure.

Figure 6B:
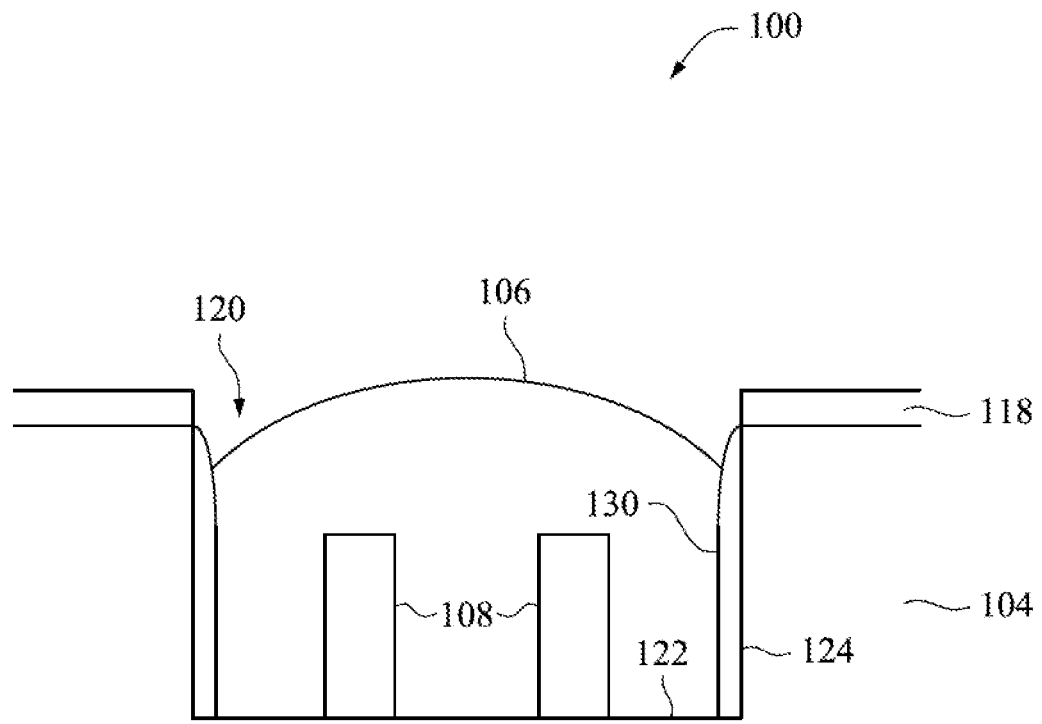

FIG. 6B is a cross-sectional diagram of the integrated circuit 100 at an intermediate stage of processing, according to one embodiment. The integrated circuit 100 of FIG. 6B is substantially similar to the integrated circuit 100 of FIG. 6A, except that a top surface of the photosensitive material 106 is curved. In practice, many embodiments of a photodetector 102 as described herein may have a curved surface as in FIG. 6B. Other surface shapes for the photosensitive material 106 are possible without departing from the scope of the present disclosure.

Figure 7A:
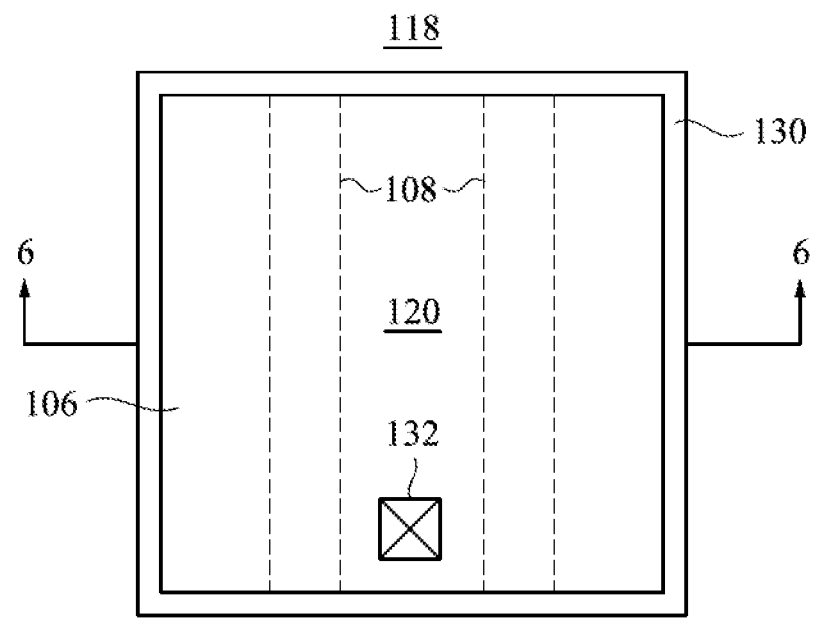
FIG. 7A is a top view of the integrated circuit of FIG. 6, according to one embodiment.

FIG. 7A is a top view of the integrated circuit 100 of FIG. 6A, according to one embodiment. FIG. 7A illustrates an embodiment in which the trench 120 has a substantially rectangular shape. Alternatively, the trench 120 could have a circular shape or another shape without departing from the scope of the present disclosure. FIG. 7A illustrates that the dielectric structures 108 extend along the length of the trench. The trench 120 is filled with the photosensitive material 106. The photosensitive material 106 covers the dielectric structures 108. FIG. 6 represents a view taken along the cross-section lines 6 in FIG. 7A. Other shapes and dimensions of the trench 120 and the dielectric structures 108 can be utilized without departing from the scope of the present disclosure.

FIG. 7A also illustrates an electrical contact 132 contacting the photosensitive material 106. In practice the electrical contact 132 will not be present at this stage of processing. However, it is instructive to note that one or more electrical contacts 132 may eventually be formed to provide bias voltages to the photosensitive material 106 and to receive signals from the photosensitive material 106. The electrical contacts 132 may illustrate connections by which the photosensitive material 106 is connected to the control circuitry 112. In other embodiments, there may not be electrical contacts to the photosensitive material 106.

Figure 7B:
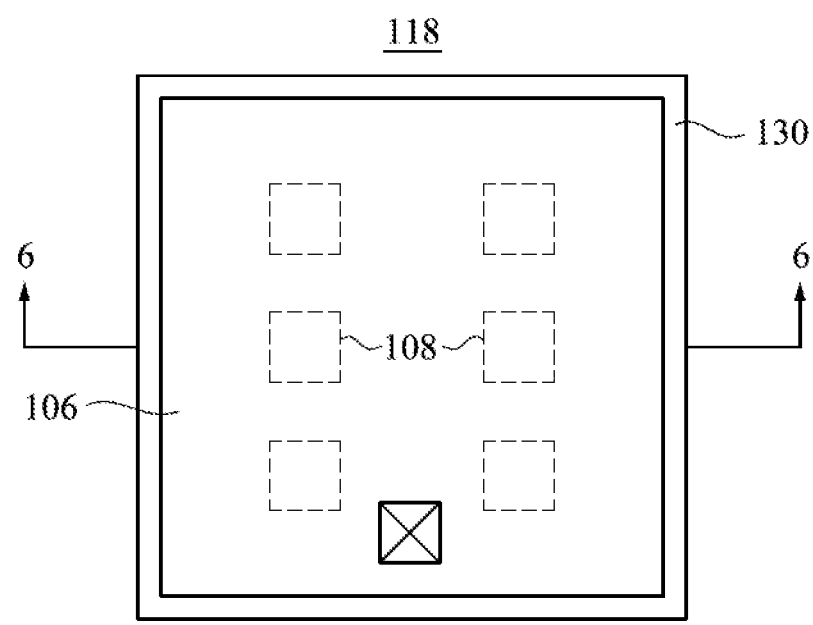
FIG. 7B is a top view of the integrated circuit of FIG. 6, according to one embodiment.

FIG. 7B is a top view of the integrated circuit 100 of FIG. 6 at the intermediate stage of processing and FIG. 6, according to one embodiment. The integrated circuit 100 and FIG. 7B is substantially similar to that of FIG. 7A, except that there is a different number of dielectric structures 108. Additionally, the dielectric structures 108 have different shapes than the dielectric structures 108 of FIG. 7A. Many other configurations of dielectric structures 108 can be utilized without departing from the scope of the present disclosure.

Figure 8:
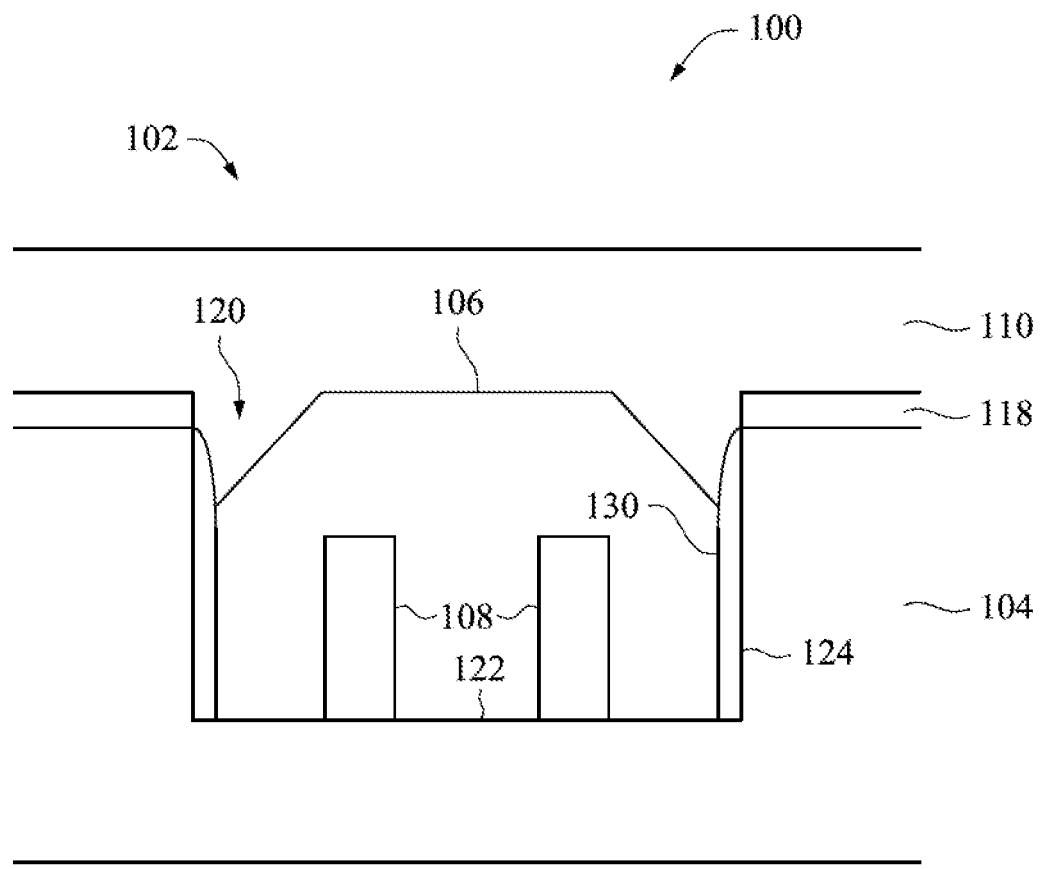

FIG. 8 is a cross-sectional view of the integrated circuit 100 at an intermediate stage of processing, according to one embodiment. In FIG. 8, a layer of dielectric material 110 has been deposited over the photosensitive material 106 and over the layer of dielectric material 118. The layer of dielectric material 110 is a dielectric material. The layer of dielectric material 110 can include one or more of silicon oxide, silicon nitride, or other dielectric materials. Accordingly, the layer of dielectric material 110 can be another layer of dielectric material.

In one embodiment, the layer of dielectric material 110 is a same material as the dielectric structures 108 and the dielectric sidewall coating 130. Alternatively, the layer of dielectric material 110 can be a different material than the dielectric structures 108 and the dielectric sidewall coating 130.

The semiconductor substrate 104, the photosensitive material 106, the dielectric structures 108, the dielectric sidewall coating 130, and the layer of dielectric material 110 collectively comprise a photodetector 102. When light is incident on the photosensitive material 106, the photosensitive material 106 may absorb the light. Absorption of light causes electrons to enter the conduction band. The current of electrons can flow indicating the intensity or brightness of the light. As described previously, and as will be illustrated in more detail below, the combination of the photosensitive material 106, the dielectric structures 108, the dielectric sidewall coating 130, and the layer of dielectric material 110 result in a greater likelihood of total internal reflection within the photosensitive material and a correspondingly longer path length for light within the photosensitive material 106. This results in greater sensitivity of the photodetector 102.

Figure 9A:
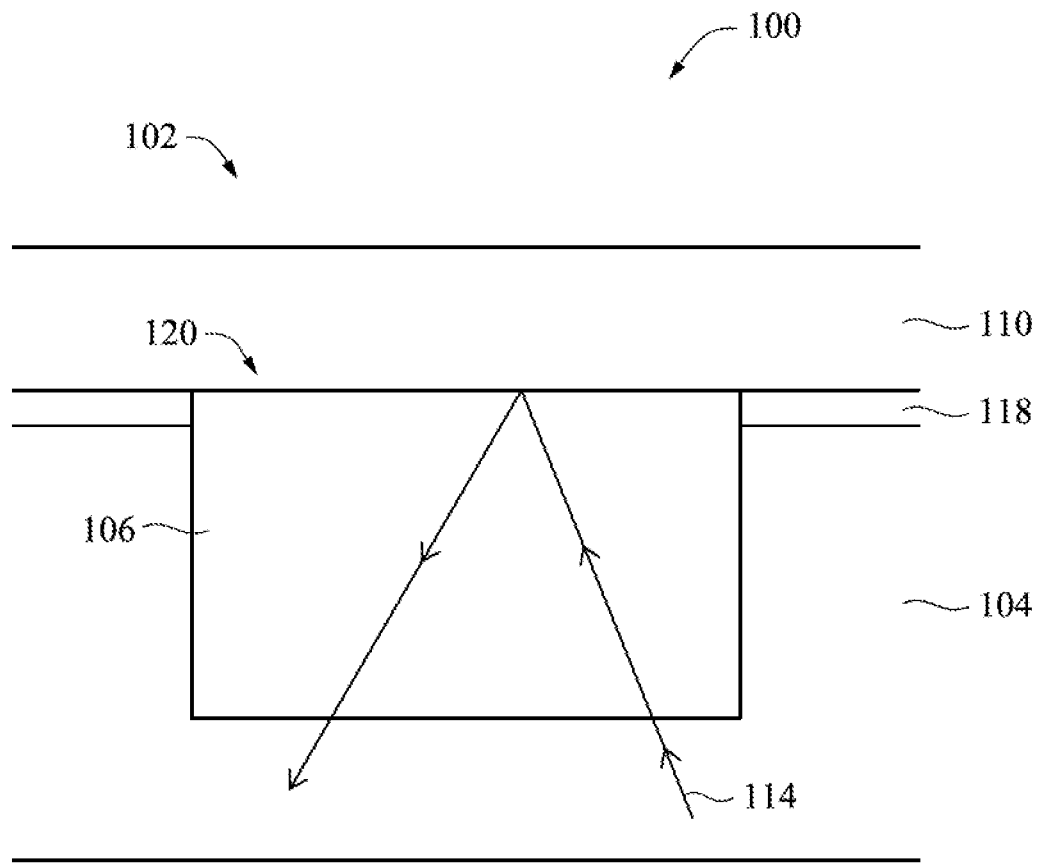
FIG. 9A illustrates a path of light through an integrated circuit, according to one embodiment.

FIG. 9A is a cross-section of an integrated circuit 100, according to one embodiment. FIG. 9A illustrates an embodiment of a photodetector 102 without the dielectric structures 108 and the dielectric sidewall coating 130 in the trench 120. In other embodiments of FIG. 9A, dielectric structures 108 and/or dielectric sidewall coating 130 are included in photodetector 102 of FIG. 9A.

FIG. 9A illustrates a likely path of travel of light 114 that enters the photosensitive material 106 at a particular angle via the semiconductor substrate 104. The light proceeds toward the layer of dielectric material 110. If the angle is larger than the critical angle of total internal reflection based on the materials of the photosensitive material 106 and the layer of dielectric material 110, then the light 114 may reflect only a single time and then travel toward the semiconductor substrate 104 and pass from the photosensitive material 106 to the semiconductor substrate 104. As described previously, an individual photon may or may not be absorbed by the photosensitive material 106 while traveling within the photosensitive material 106. The longer the path of travel within the photosensitive material 106, the more likely it is that the photon will be absorbed and thereby be detected.

In one embodiment, a photodetector 102 in accordance with principles of the present disclosure provides a longer path length for photons through the photosensitive material. The absorption of photons by the photosensitive material, and the corresponding electrical signal, may be considered a quantum effect. Accordingly, increasing the quantum effect path length, i.e. the path length of the photon through photosensitive material during which absorption may occur, is greatly increased by principles of the present disclosure. This is due to the large number of total internal reflections that may occur in the photosensitive material 106. Accordingly, the photodetector 102 has a relatively high sensitivity.

Figure 9B:
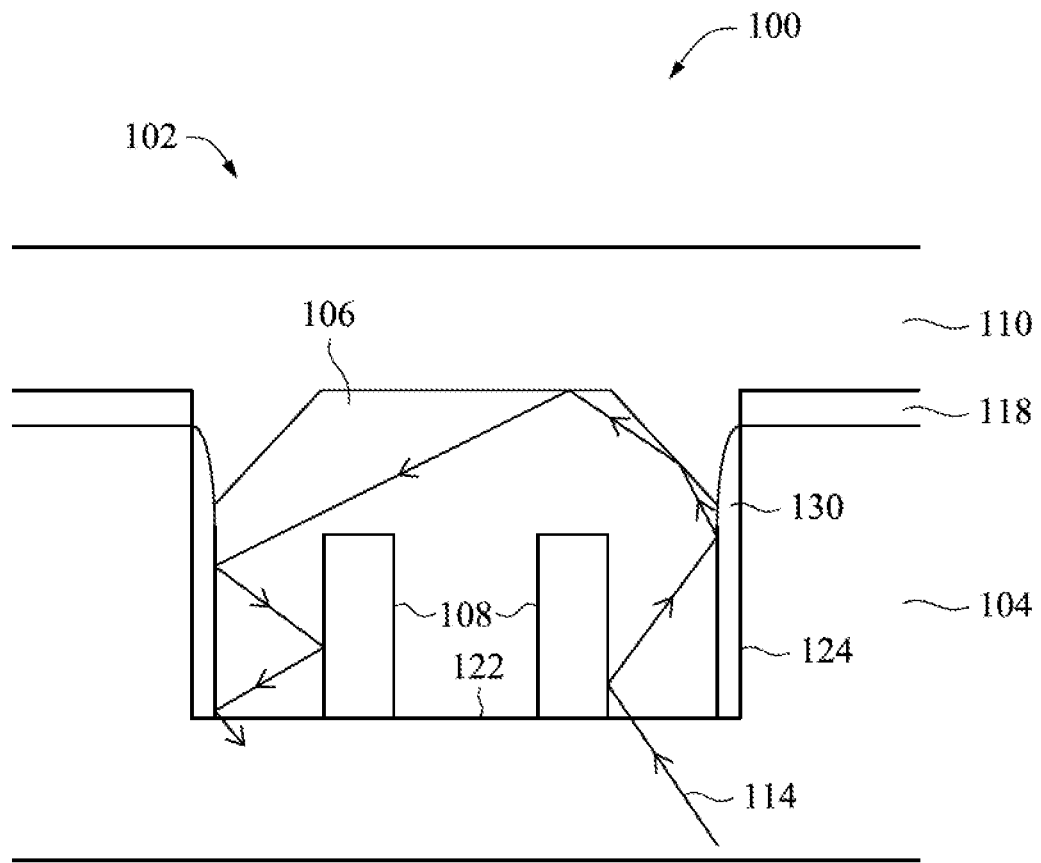
FIG. 9B illustrates a path of light through the integrated circuit of FIG. 8, according to one embodiment.

FIG. 9B illustrates the integrated circuit 100 of FIG. 8 including the dielectric structures 108 and the dielectric sidewall coating 130. FIG. 9B illustrates a likely path of travel of light 114 that enters the photosensitive material 106 at a particular angle via the semiconductor substrate 104. The light 114 first reflects off one of the dielectric structures 108. The light 114 then reflects off the dielectric sidewall coating 130. The light then reflects off the layer of dielectric material 110. The light reflects again off the layer of dielectric material 110. The light then reflects off the dielectric sidewall coating 130. The light then reflects off the other of the dielectric structures 108. The light again reflects off the dielectric sidewall coating 130 and then passes from the photosensitive material 106 into the semiconductor substrate 104. Each of these reflections occurs due to the principle of total internal reflection.

The light 114 has a much longer possible path of travel in FIG. 9B than in FIG. 9A. Accordingly, it is much more likely that the light 114 will be absorbed by the photosensitive material 106 during the path of travel illustrated in FIG. 9B than during the path of travel illustrated in FIG. 9A.

The photodetector 102 of FIG. 9B promotes total internal reflection of light incident on the photosensitive material 106 from a large range of possible angles. Accordingly, the photodetector 102 of FIG. 9B has improved sensitivity for a wide range of incident light angles.

Though not illustrated in the figures, the light 114 may also refract somewhat when passing between the semiconductor substrate 104 and the photosensitive material 106.

Figure 10A:
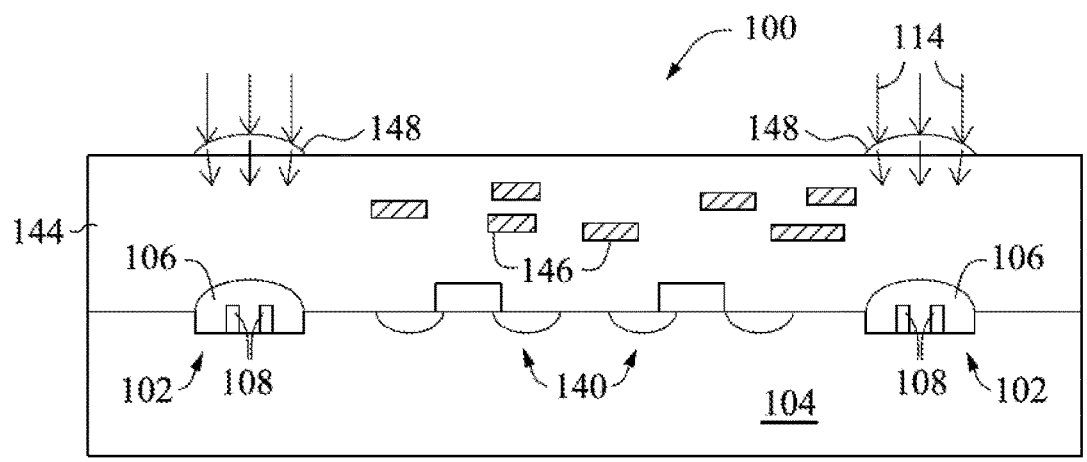
FIG. 10A illustrates a front side illuminated integrated circuit, according to one embodiment.

FIG. 10A is a cross-section of an integrated circuit 100, according to one embodiment. The integrated circuit 100 includes a semiconductor substrate 104 and a dielectric stack 144 positioned on the semiconductor substrate 104. The integrated circuit 100 includes a plurality of photodetectors 102. The photodetectors 102 can include embodiments of the photodetectors described herein in relation to FIGS. 1-8, 9B. In particular, the photodetectors 102 include a photosensitive layer 106 and one or more dielectric structures 108 positioned in the photosensitive material 106.

In addition to the photo sensors 102, the integrated circuit 100 includes common integrated circuit structures and components. For example, the integrated circuit 100 includes transistors 140 formed in conjunction with the semiconductor substrate 104. The integrated circuit 100 includes metal interconnects 146 positioned throughout the dielectric stack 144. The metal interconnects 146 enable connection between transistors 140, the photodetectors 102, connection pads (not shown), and any other circuit components that may be included in the integrated circuit 100. The transistors 140 may include the control circuitry 112 described in relation to FIG. 1. The metal interconnects 146 enable application of bias voltages to the photodetectors 102, as well as the reading of signals from the photodetectors 102.

The integrated circuit 100 of FIG. 10A is a front side illumination photonic integrated circuit. Front side illumination refers to a configuration in which light passes to the photodetectors 102 via the front side of the integrated circuit 100. As used herein, front side refers to the side of the integrated circuit that is closer to the metal interconnects 146 or the dielectric stack 144 than to the semiconductor substrate 104. In common parlance, the main semiconductor substrate 104 corresponds to the backside of an integrated circuit, even if the integrated circuit is oriented upside down such that the dielectric stack 144 is closer to the ground that is the semiconductor substrate 104.

The integrated circuit 100 of FIG. 10A includes lenses 148 formed at the front or top surface of the integrated circuit 100. The lenses 148 focus light 114 toward the photosensitive material 106 of the photodetectors 102. The lenses can include any type of lens commonly used in photonic integrated circuits. Lenses 148 can include reflow type lenses, non-reflow type lenses, etching lenses, and other types of lenses. While the lenses 148 of the integrated circuit 100 of FIG. 10A are shown as being formed on the surface of the integrated circuit 100, the lenses 148 may also be positioned inside of the dielectric stack 144.

The dielectric stack 144 includes a plurality of transparent dielectric layers between the lenses 148 and the photodetectors 102. This enables light to pass freely through the dielectric layers to the photosensitive material 106. The metal interconnects 146 are positioned away from the expected path of the light 114 between the lenses 148 and the photodetectors 102. The dielectric stack 144 can include the layer of dielectric material 110.

Figure 10B:
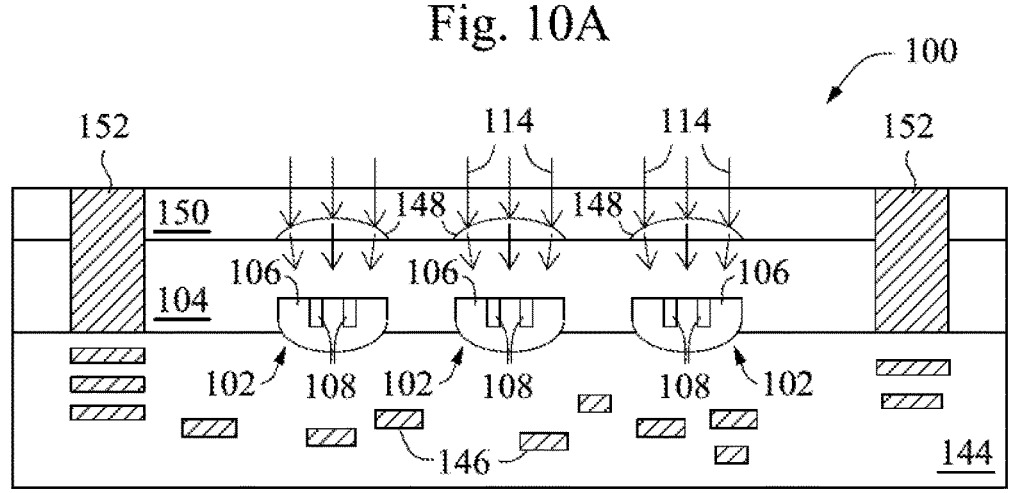
FIG. 10B illustrates a back side illuminated integrated circuit, according to one embodiment.

FIG. 10B is a cross-section of an integrated circuit 100, according to one embodiment. The integrated circuit 100 includes a semiconductor substrate 104 and a dielectric stack 144 positioned on the semiconductor substrate 104. The integrated circuit 100 includes a plurality of photodetectors 102. The photodetectors 102 can include embodiments of the photodetectors described herein in relation to FIGS. 1-8, 9B. In particular, the photodetectors 102 include a photosensitive layer 106 and one or more dielectric structures 108 positioned in the photosensitive material 106. In addition to the photo sensors 102, the integrated circuit 100 includes common integrated circuit structures and components as described in relation to the integrated circuit 100 of FIG. 10A.

The integrated circuit 100 of FIG. 10B is a backside illumination photonic integrated circuit. This means that light passes to the photodetectors 102 via the semiconductor substrate 104. As used herein, "backside" refers to the side of the integrated circuit that is closer to the semiconductor substrate 104 than to the dielectric stack 144.

The integrated circuit 100 of FIG. 10B includes a silicon on insulator configuration. In particular, an insulator layer 150 is coupled to the backside of the semiconductor substrate 104. The integrated circuit 100 of FIG. 10B includes lenses 148 formed in the insulator layer 150. The lenses 148 focus light 114 toward the photosensitive material 106 of the photodetectors 102. The lenses 148 can include any type of lens commonly used in photonic integrated circuits. Lenses 148 can include reflow type lenses, non-reflow type lenses, etching lenses, and other types of lenses. Light 114 can pass freely through the insulator layer 150 and the semiconductor substrate 104 toward the photosensitive material 106.

The integrated circuit 100 of FIG. 10B also includes conductive plugs 152. The conductive plugs 152 are electrically coupled to pads or terminals of the integrated circuit 100. The conductive plugs 152 enable communication between the pads and the photodetectors 102.

Figure 10C:
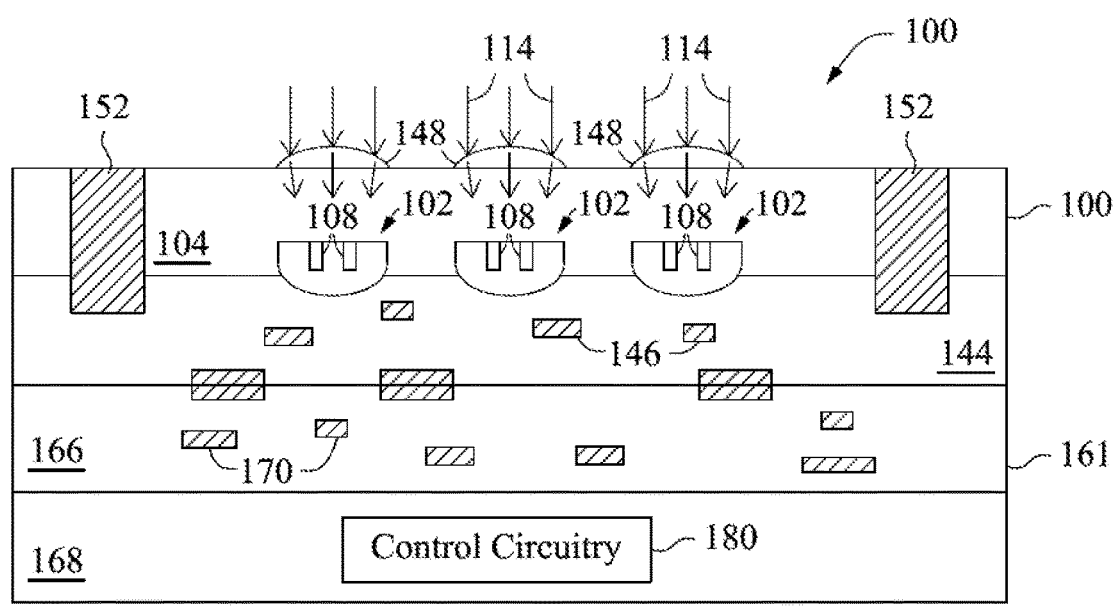
FIG. 10C illustrates a photonic device including a photonic integrated circuit and a CMOS integrated circuit bonded together, according to one embodiment.

FIG. 10C is a cross-section of the photonic device 160, according to one embodiment. The photonic device 160 includes a photonic integrated circuit 100 and a CMOS integrated circuit 161. The photonic integrated circuit 100 and the CMOS integrated circuit 161 are bonded together using common semiconductor wafer bonding techniques. The photonic integrated circuit 100 is a backside illuminated integrated circuit similar to the backside illumination integrated circuit 100 of FIG. 10B. The photonic integrated circuit 100 of FIG. 10C includes lenses 148 positioned on a back surface of the semiconductor substrate 104. The lenses focus light 114 onto the photosensitive material of the photodetectors 102.

The CMOS integrated circuit 161 includes a dielectric stack 166 and a semiconductor substrate 168. The CMOS integrated circuit 161 also includes a logic circuit 180. The logic circuit 180 can include a plurality of transistors coupled together in a complex arrangement. The logic circuit 180 can also include portions of the control circuitry 112 described in relation to FIG. 1. The CMOS integrated circuit 161 includes metal interconnects 170.

The wafer bonding techniques enable signals to pass between the photonic integrated circuit 100 and the CMOS integrated circuit 161. In particular, the logic circuit 180 can apply bias voltages to the photodetectors 102 of the photonic integrated circuit 100. The logic circuit 180 can also receive signals from the photodetectors 102. The plugs 152 enable communication between pads or terminals of the photonic integrated circuit 100 and the logic circuit 180.

Figure 11:
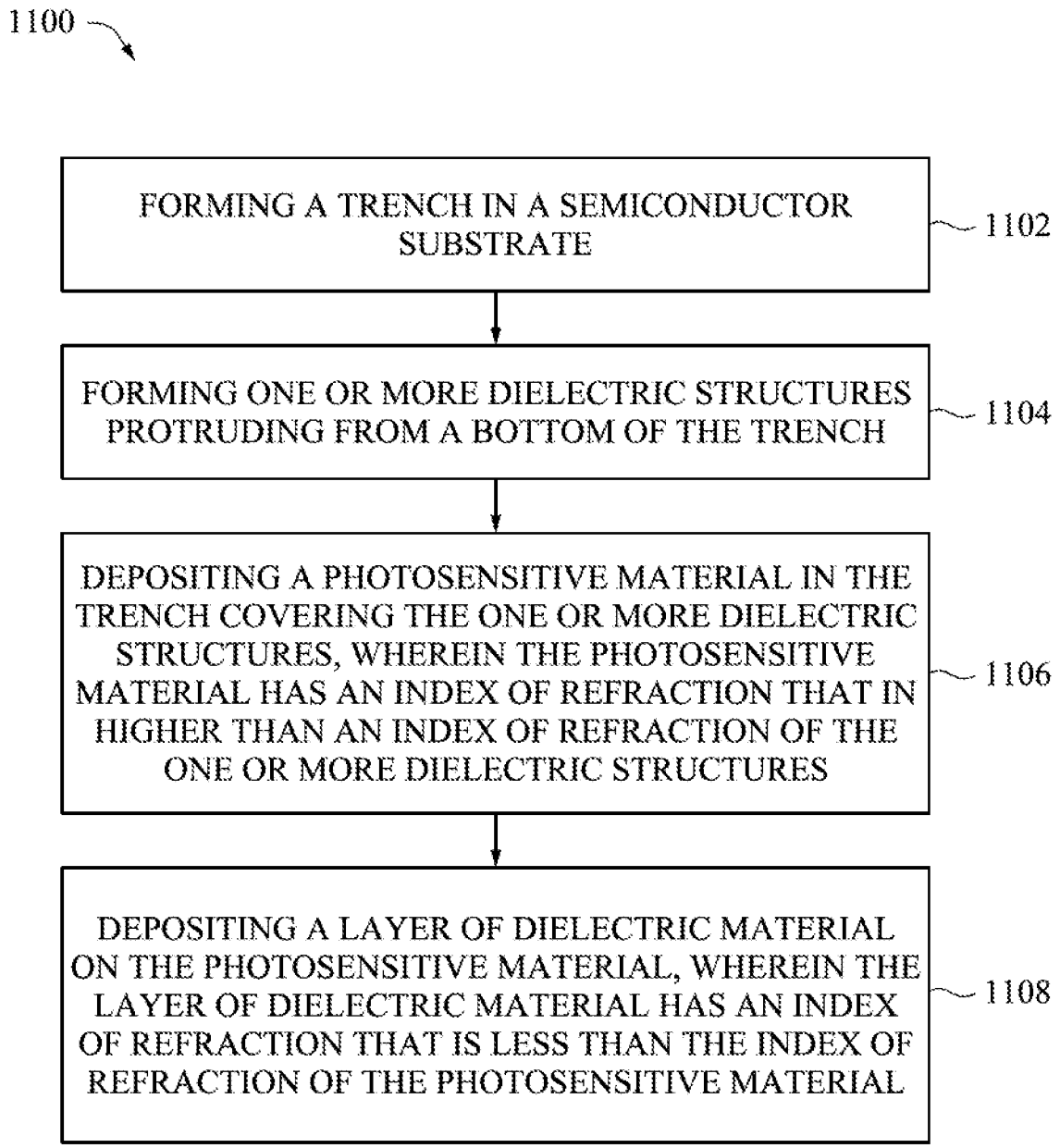
FIG. 11 is a flow diagram of a method for forming an integrated circuit, according to one embodiment.

FIG. 11 is a flow diagram of a method 1100 for forming an integrated circuit, according to one embodiment. At 1102 the method 1100 includes forming a trench in a semiconductor substrate. One example of a semiconductor substrate is the semiconductor substrate 104 of FIG. 8. One example of a trench is the trench 120 of FIG. 8. At 1104 the method 1100 includes forming one or more dielectric structures protruding from a bottom surface of the trench. One example of one or more dielectric structures are the dielectric structures 108 of FIG. 8. One example of a bottom surface of a trench is the bottom surface 122 of the trench 120 of FIG. 8. At 1106 the method 1100 includes depositing a photosensitive material in the trench covering the one or more dielectric structures, wherein the photosensitive material has an index of refraction that is higher than an index of refraction of the one or more dielectric structures. One example of a photosensitive material is the photosensitive material 106 of FIG. 8. At 1108 the method 1100 includes depositing a layer of dielectric material on the photosensitive material, wherein the dielectric material of the layer of dielectric material has an index of refraction that is less than the index of refraction of the photosensitive material. One example of a layer of dielectric material is the layer of dielectric material 110 of FIG. 8.

In one embodiment, an integrated circuit includes a semiconductor substrate and one or more dielectric structures of dielectric material protruding from a surface of the semiconductor substrate. The integrated circuit includes a photosensitive material positioned on the semiconductor substrate and covering the one or more dielectric structures. The photosensitive material has an index of refraction that is higher than an index of refraction of the dielectric material of the one or more dielectric structures. The integrated circuit includes a layer of dielectric material covering the photosensitive material and having an index of refraction that is less than an index of refraction of the photosensitive material.

In one embodiment, a method includes forming a trench in a semiconductor substrate and forming one or more dielectric structures protruding from a bottom surface of the trench. The method includes depositing a photosensitive material in the trench covering the one or more dielectric structures. The photosensitive material has an index of refraction that is higher than an index of refraction of the dielectric material of the one or more dielectric structures. The method includes depositing a layer of dielectric material on the photosensitive material, wherein the dielectric material of the layer of dielectric material has an index of refraction that is less than the index of refraction of the photosensitive material.

In one embodiment, a device includes a semiconductor substrate including a plurality of trenches and one or more dielectric structures of dielectric material protruding from a bottom surface of each trench. The device includes a photosensitive material positioned in each trench covering the one or more dielectric structures and having an index of refraction greater than an index of refraction of the one or more dielectric structures. The device includes a plurality of lenses each configured to focus light onto the photosensitive material in a respective trench. The device includes a layer of dielectric material covering the photosensitive material in each trench, the dielectric material of the layer of dielectric material having an index of refraction that is lower than the index of refraction of the photosensitive material.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a trench in a semiconductor substrate of an integrated circuit;
   forming one or more dielectric structures of dielectric material protruding from a bottom surface of the trench; and
   depositing a photosensitive material in the trench covering the one or more dielectric structures, wherein the photosensitive material has an index of refraction that is higher than an index of refraction the dielectric material of the one or more dielectric structures.

2. The method of claim 1, comprising depositing a layer of dielectric material on the photosensitive material, wherein the dielectric material of the layer of dielectric material has an index of refraction that is less than the index of refraction of the photosensitive material.

3. The method of claim 2, further comprising depositing a dielectric sidewall coating of dielectric material on sidewalls of the trench, wherein depositing the photosensitive material includes covering the dielectric sidewall coating on the sidewalls of the trench with the photosensitive material.

4. The method of claim 1, comprising forming control in the integrated circuit.

5. The method of claim 4, comprising detecting, with the control circuitry, light incident on the photosensitive material based on an electrical current from the photosensitive material.

6. The method of claim 1, wherein the one or more dielectric structures include one or more columns extending from the bottom of the trench.

7. The method of claim 6, wherein the columns terminate at or below a top of the trench.

8. The method of claim 1, further comprising forming a lens configured to focus light on the photosensitive material.

9. The method of claim 1, wherein the photosensitive material and the semiconductor substrate act as a photodetector that detects light by absorbing photons in the photosensitive layer and generating electrical signals indicative of the photons absorbed by the photosensitive material.

10. The integrated circuit of claim 9, wherein the photodetector is a photodiode.

11. The integrated circuit of claim 1, wherein the photosensitive material includes germanium.

12. A method comprising:
    forming a trench in a semiconductor substrate of an integrated circuitry;
    forming a first pillar of dielectric material protruding from a bottom of the trench to a height lower than a top of the semiconductor substrate; and
    forming a photosensitive material on the semiconductor material, the photosensitive material covering the pillar of dielectric material and having an index of refraction greater than an index of refraction of the pillar of dielectric material.

13. The method of claim 12, wherein the photosensitive material includes germanium.

14. The method of claim 12, further comprising forming a lens configured to focus light on the photosensitive material.

15. The method of claim 12, wherein the photosensitive material and the semiconductor substrate act as a photodetector that detects light by absorbing photons in the photosensitive layer and generating electrical signals indicative of the photons absorbed by the photosensitive material.

16. The method of claim 12, comprising:
    depositing a dielectric sidewall coating of dielectric material on sidewalls of the trench, wherein depositing the photosensitive material includes covering the dielectric sidewall coating on the sidewalls of the trench with the photosensitive material
    depositing a layer of dielectric material on the photosensitive material, wherein the dielectric material of the layer of dielectric material has an index of refraction that is less than the index of refraction of the photosensitive material.

17. A method, comprising:
    forming a plurality of trenches in a semiconductor substrate;

forming one or more dielectric structures of dielectric material protruding from a bottom surface of each trench;

depositing a photosensitive material positioned in each trench covering the one or more dielectric structures and having an index of refraction greater than an index of refraction of the dielectric material of the one or more dielectric structures;

forming a layer of dielectric material covering the photosensitive material in each trench, the dielectric material of the layer of dielectric material having an index of refraction that is lower than the index of refraction of the photosensitive material; and forming a plurality of lenses each configured to focus light onto the photosensitive material in a respective trench.

18. The method of claim 17, wherein the semiconductor substrate and the photosensitive material are in a first integrated circuit, the method further comprising boding a second integrated circuit to the first integrated circuit, the second integrated circuit including control circuitry configured to receive electrical signals from the photosensitive material responsive to light incident on the photosensitive material.

19. The method of claim 18, comprising forming, in the first integrated circuit, a plurality of transistors communicatively coupled to the photosensitive material.

20. The method of claim 17, further comprising depositing a dielectric sidewall coating of dielectric material on sidewalls of the trenches, wherein depositing the photosensitive material includes covering the dielectric sidewall coating on the sidewalls of the trenches with the photosensitive.

* * * * *